US012660533B2

(12) United States Patent
Huang et al.

(10) Patent No.: US 12,660,533 B2
(45) Date of Patent: Jun. 16, 2026

(54) HIGH-K ISOLATION OF FIN STRUCTURES

(71) Applicant: Taiwan Semiconductor Manufacturing Company, Ltd., Hsinchu (TW)

(72) Inventors: Kang Huang, Hsinchu (TW); Deng-Ming Juo, Tainan City (TW); Wan-Chun Pan, Hsinchu (TW); Shich-Chang Suen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 419 days.

(21) Appl. No.: 18/337,887

(22) Filed: Jun. 20, 2023

(65) Prior Publication Data

US 2024/0429312 A1 Dec. 26, 2024

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10P 14/692* | (2026.01) |
| *H10P 95/00* | (2026.01) |

(52) U.S. Cl.
CPC ........... *H10D 30/43* (2025.01); *H10D 30/014* (2025.01); *H10D 30/6735* (2025.01); *H10D 62/121* (2025.01); *H10P 14/69215* (2026.01); *H10P 14/69392* (2026.01); *H10P 95/064* (2026.01)

(58) Field of Classification Search
CPC .. H10D 30/6735; H10D 30/014; H10D 30/62; H10D 30/024; H01L 21/02181; H10P 95/064
See application file for complete search history.

(56) References Cited

U.S. PATENT DOCUMENTS

| | | | |
|---|---|---|---|
| 11,462,612 B2 | 10/2022 | Cheng et al. | |
| 2020/0176560 A1* | 6/2020 | Yu ........................ | H10D 64/017 |
| 2021/0226038 A1 | 7/2021 | Lai et al. | |
| 2022/0139903 A1* | 5/2022 | Hung ................. | H10D 84/0193 |
| | | | 257/355 |

FOREIGN PATENT DOCUMENTS

TW          I783606 B     11/2022

* cited by examiner

*Primary Examiner* — Changhyun Yi
(74) *Attorney, Agent, or Firm* — Ingrassia Fisher & Lorenz, LLP | IF&L

(57) ABSTRACT

Provided are semiconductor devices and methods for fabricating such devices. An exemplary method includes forming fin structures separated by an isolation material; depositing a high-k material over the fin structures and isolation material, wherein the high-k material includes lower portions located between fin structures and an upper portion located above the fin structures; depositing a topography-improving capping layer over the high-k material; performing a chemical mechanical planarization (CMP) process to remove the capping layer and the upper portion of the high-k material and to define high-k insulation segments.

20 Claims, 17 Drawing Sheets

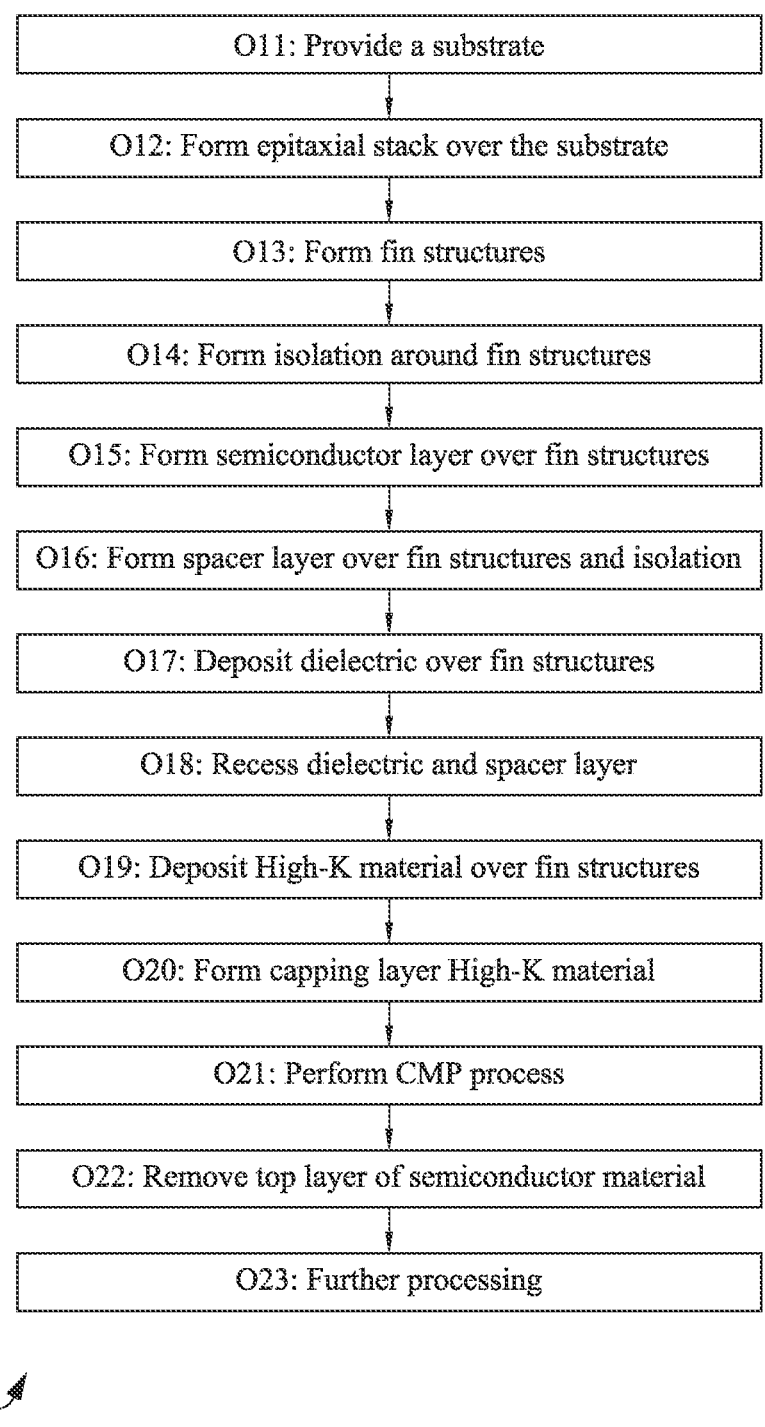

O11: Provide a substrate

O12: Form epitaxial stack over the substrate

O13: Form fin structures

O14: Form isolation around fin structures

O15: Form semiconductor layer over fin structures

O16: Form spacer layer over fin structures and isolation

O17: Deposit dielectric over fin structures

O18: Recess dielectric and spacer layer

O19: Deposit High-K material over fin structures

O20: Form capping layer High-K material

O21: Perform CMP process

O22: Remove top layer of semiconductor material

O23: Further processing

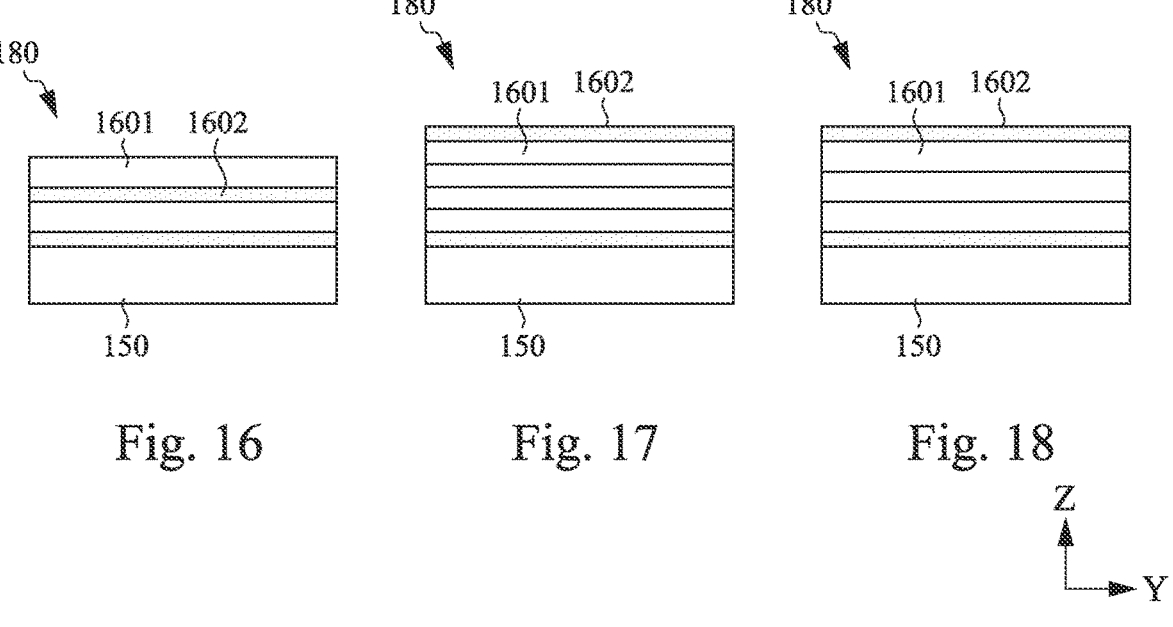
Fig. 16          Fig. 17          Fig. 18
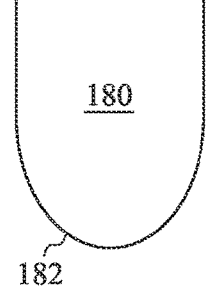
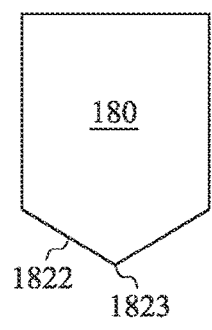
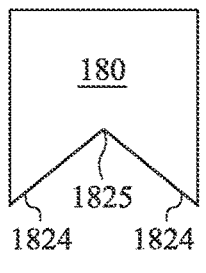
Fig. 19          Fig. 20          Fig. 21

HIGH-K ISOLATION OF FIN STRUCTURES

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far the demand has been met in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFET devices and GAA devices are compatible with complementary metal-oxide-semiconductor (CMOS) processes. Further, the three-dimensional structure of such devices allows them to be aggressively scaled while maintaining gate control and mitigating SCEs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a method, in accordance with some embodiments.

FIGS. 16-18 are schematic views of multi-layer isolation regions, in accordance with some embodiments.

FIGS. 19-21 are schematic views of isolation regions having different bottom surfaces, in accordance with some embodiments.

DETAILED DESCRIPTION

Figure 2:
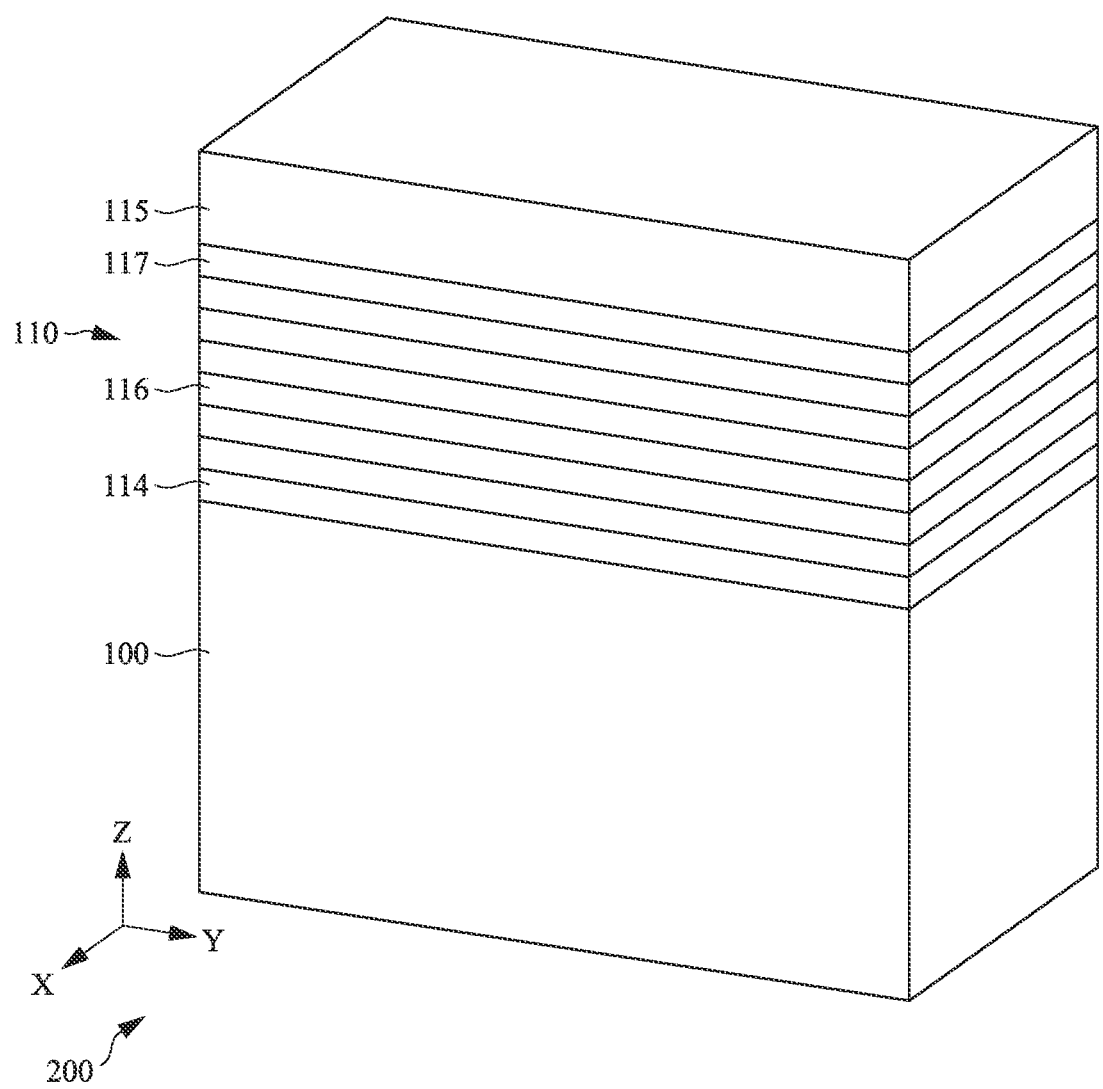
FIGS. 2-3 are perspective views of a device during successive stages of fabrication, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material layer" is a layer that includes at least 50 wt. % of the identified material, for example at least 60 wt. % of the identified material, at least 75 wt. % of the identified material, or at least 90 wt. % of the identified material, or substantially 100 wt. % of the identified material; and a layer that is a "material" includes at least 50 wt. % of the identified material, for example at least 60 wt. % of the identified material, at least 75 wt. % of the identified material, or at least 90 wt. % of the identified material, or substantially 100 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. %, or substantially 100 wt. %, titanium nitride.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to #0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

For the sake of brevity, known techniques related to semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It is also noted that this disclosure presents embodiments in the form of multi-gate transistors. Multi-gate transistors include those transistors whose gate structures are formed on at least two sides of a channel region. These multi-gate devices may include a P-type metal-oxide-semiconductor device or an N-type metal-oxide-semiconductor multi-gate device. Specific examples may be presented and referred to herein as FinFET devices, on account of their fin-like structure. Also presented herein are embodiments of a type of multi-gate transistor referred to as a gate-all-around (GAA) device. A GAA device includes any device that has its gate structure, or portion thereof, formed on four sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Herein, the term "nanosheet" is intended to include nanowire and bar-shaped configurations.

The gate all around (hereinafter "GAA") transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed along the patterned sacrificial layer using a self-aligned process. The sacrificial layer is then removed, and the remaining spacers may then be used to pattern the GAA structure.

As described herein, processes are performed to isolate adjacent fin structures. For example, high-k isolation structures are formed between adjacent fin structures, such as during front-end-of-line (FEOL) processing and before gate formation. As a result, after gate formation, there is no need to etch material laterally adjacent to the gates to form isolation regions. Further, the use of the high-k isolation regions provides for cell height reduction as compared to other isolation.

In certain embodiments, the high-k material is polished during a chemical mechanical planarization (CMP) process that is performed with a silica-based slurry that provides for high selectivity. In certain embodiments, the high-k material is hafnium oxide. In certain embodiments, the CMP process defines the shape of the high-k isolation regions.

In exemplary embodiments, the CMP process includes three stages for selective planarization. A first stage removes a capping layer over the high-k isolation material and lands on the high-k isolation material, a second stage removes the high-k isolation material that lies above the underlying fin structures and lands on the fin structures, and a third stage provides for height control of the formed high-k isolation regions. The first stage is selective to removing the capping layer, the second stage is selective to removing the high-k isolation material, and the third stage is non-selective. The three-stage CMP process with selected selectivities achieves improved within-wafer (WiW), within-die (WiD), and wafer-to-wafer (WWW) uniformity.

In exemplary embodiments, the high-k isolation regions are multi-layer structures formed by layers of high-k material and by insertion layers that may be provided to improve certain properties of the high-k material layers. For example, an insertion layer may be formed from a material that improves crystal uniformity of the high-k material. In certain embodiments, the high-k isolation regions are formed from layers of hafnium oxide and insertion layers of silicon oxide.

Embodiments of the present disclosure offer advantages over the existing art, though it is understood that other embodiments may offer different advantages, not all advantages are necessarily discussed herein, and no particular advantage is required for all embodiments. For example, embodiments discussed herein include fin structures and related front-end-of-line (FEOL) processing before formation of sacrificial gates, replacement metal gates, and further processing.

For purposes of the discussion that follows, FIG. 1 provides a flow chart of a method M10 for fabricating a semiconductor device. FIG. 1 is described in conjunction with FIGS. 2-13, which illustrate a semiconductor device 200 at various stages of fabrication in accordance with some embodiments of the present disclosure of the method M10. The method M10 is merely an example, and is not intended to limit the present disclosure beyond what is explicitly recited in the claims. Additional steps may be provided before, during, and after method M10, and some of the steps described can be moved, replaced, or eliminated for additional embodiments of method M10. Additional features may be added in the semiconductor device depicted in the Figures and some of the features described below can be replaced, modified, or eliminated in other embodiments of the semiconductor device.

As with the other method embodiments and exemplary devices discussed herein, it is understood that parts of the semiconductor device 200 may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the process steps of method M10, including any descriptions given with reference to the Figures, as with the remainder of the method and exemplary figures provided in this disclosure, are merely exemplary and are not intended to be limiting beyond what is specifically recited in the claims that follow.

At operation O11, the method M10 (FIG. 1) provides a substrate 100, as shown in FIG. 2. In some embodiments, the substrate 100 may be a semiconductor substrate such as a silicon (Si) substrate. The substrate 100 may include various layers, including conductive or insulating layers formed on a semiconductor substrate. The substrate 100 may include various doping configurations depending on design requirements as is known in the art. For example, different doping profiles (e.g., p-well, n-well) may be formed on the substrate 100 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 100 includes a single crystalline semiconductor layer on at least its surface portion. The substrate 100 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 100 may include a compound semiconductor and/or an alloy semiconductor. In the illustrated embodiment, the substrate 100 is made of crystalline Si.

At operation O12, the method M10 forms a stack of epitaxial layers over the substrate 100. The epitaxial stack 110 includes epitaxial layers 114 of a first composition interposed by epitaxial layers 116 of a second composition. The first and second composition may be different. Embodiments are possible including those that provide for a first composition and a second composition having different oxidation rates and/or etch selectivity. In an embodiment, the epitaxial layers 114 are silicon germanium (SiGe) and the epitaxial layers 116 are silicon (Si). In embodiments wherein the epitaxial layer 114 includes SiGe and the epitaxial layer 116 includes silicon, the silicon oxidation rate is less than the SiGe oxidation rate. It is noted that five layers of epitaxial layers 114 and four layers of epitaxial layers 116 are illustrated in FIG. 2, which is for illustrative purposes only and not intended to be limiting beyond what is specifically recited in the claims. It can be appreciated that any number of epitaxial layers may be formed in the epitaxial stack 110; the number of layers depending on the desired number of channels regions for the GAA device 200. In some embodiments, the number of epitaxial layers 116 is between two and ten, such as six or seven.

As shown the epitaxial stack 110 includes an uppermost or top layer 117 of the epitaxial layers 116 and an uppermost or top layer 115 of the epitaxial layers 114.

In some embodiments, each epitaxial layer 114 has a thickness ranging from about 5 nm to about 15 nm. The epitaxial layers 114 may be substantially uniform in thickness. In the illustrated embodiment, the top layer 115 has a greater thickness than the other epitaxial layers 114.

In some embodiments, each epitaxial layer 116 has a thickness ranging from about 5 nm to about 15 nm. In some embodiments, the epitaxial layers 116 of the stack are substantially uniform in thickness. As described in more detail below, the epitaxial layer 116 may serve as channel region(s) for a subsequently formed multi-gate device and has a thickness chosen based on device performance considerations. The epitaxial layer 114 may serve to define a gap between adjacent channel region(s) for a subsequently formed multi-gate device and has a thickness chosen based on device performance considerations.

By way of example, epitaxial growth of the epitaxial stack 110 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 116 include the same material as the substrate 100. In some embodiments, the epitaxially grown layers 114 and 116 include a different material than the substrate 100. As stated above, in at least some examples, the epitaxial layer 114 includes an epitaxially grown $Si_{1-x}Ge_x$ layer (wherein x is from about 0.10 to about 0.55) and the epitaxial layer 116 includes an epitaxially grown silicon (Si) layer. Alternatively, in some embodiments, either of the epitaxial layers 114 and 116 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 114 and 116 may be chosen based on providing differing oxidation, etch selectivity properties. In various embodiments, the epitaxial layers 114 and 116 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. In some embodiments, the bottom layer and the top layer of the epitaxial stack 110 are SiGe layers. In alternative embodiments, the bottom layer of the epitaxial stack 110 is a Si layer and the top layer of the epitaxial stack 110 is a SiGe layer.

Figure 3:
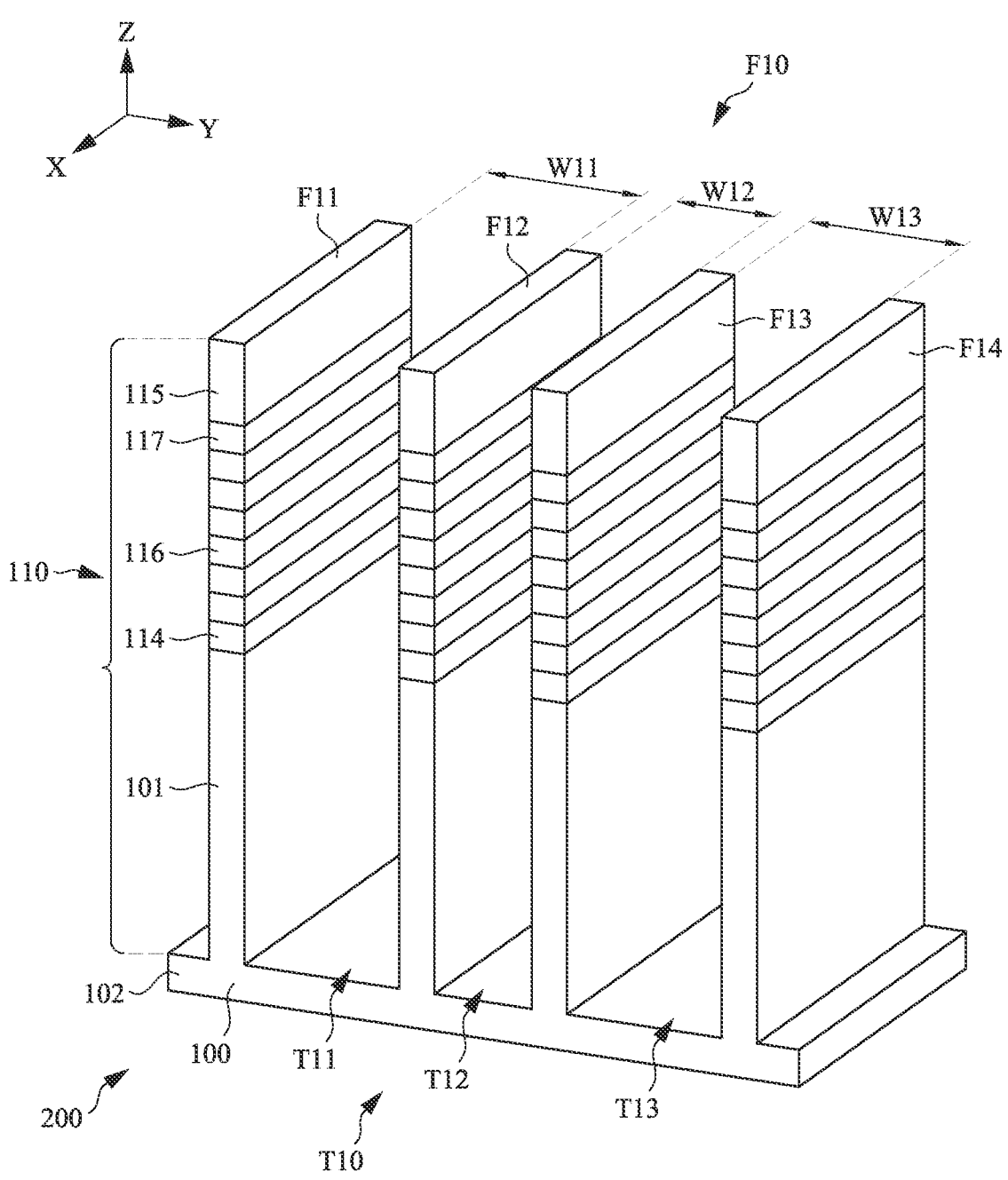

Cross-referencing FIGS. 1 and 3, the method M10 further includes: (O13) forming fin structures extending along a first direction over the substrate 100. Specifically, at operation O13, the method M10 patterns the epitaxial stack 110 to form semiconductor fin structures F10, such as fin structures F11, F12, F13, and F14. In some embodiments, the operation O13 includes forming a mask layer (not shown) over the epitaxial stack 110, patterning the mask layer, patterning the epitaxial stack 110 in an etching process, such as a dry etch (e.g., reactive ion etching), a wet etch, and/or other suitable process, through openings defined in the patterned mask layer. The stacked epitaxial layers 114 and 116 and a portion 101 of the underlying substrate 100 are thereby patterned into the fin structures F10. While FIG. 3 illustrates the formation of four fin structures F10, any suitable number of the fins may be formed. Trenches T10 are etched between adjacent fin structures F10, such as trench T11, trench T12, and trench T13.

In various embodiments, each fin structures F10 includes an upper portion of the interleaved epitaxial layers 114 and 116, and a bottom portion 101 that is formed from the etched substrate 100. Fin structures F10 protrude upwardly in the Z-direction from the unetched portion 102 of the substrate 100, extend lengthwise in the X-direction, and are spaced apart in the Y-direction. Sidewalls of each fin structures F10 may be straight or inclined (not shown). The fin structures F10 may have a same width or different widths.

FIG. 3 shows four fin structures F10 (individually labeled as F11, F12, F13 and F14) for illustration but not to limit the present disclosure. It should be noted that a width W11 of a trench T11 formed between the fin structures F11 and F12 is greater than a width W12 of a trench T12 between the fin structures F12 and F13, and the width W11 is substantially the same as a width W13 of a trench T13 between the fin structures F13 and F14. In some embodiments, the four fin structures F11, F12, F13 and F14 as a unit are repeatedly arranged over the substrate 100, and a trench formed between the fin structure F14 and the adjacent fin structure F11 has a width, which is substantially the same as the width W12.

Figure 4:
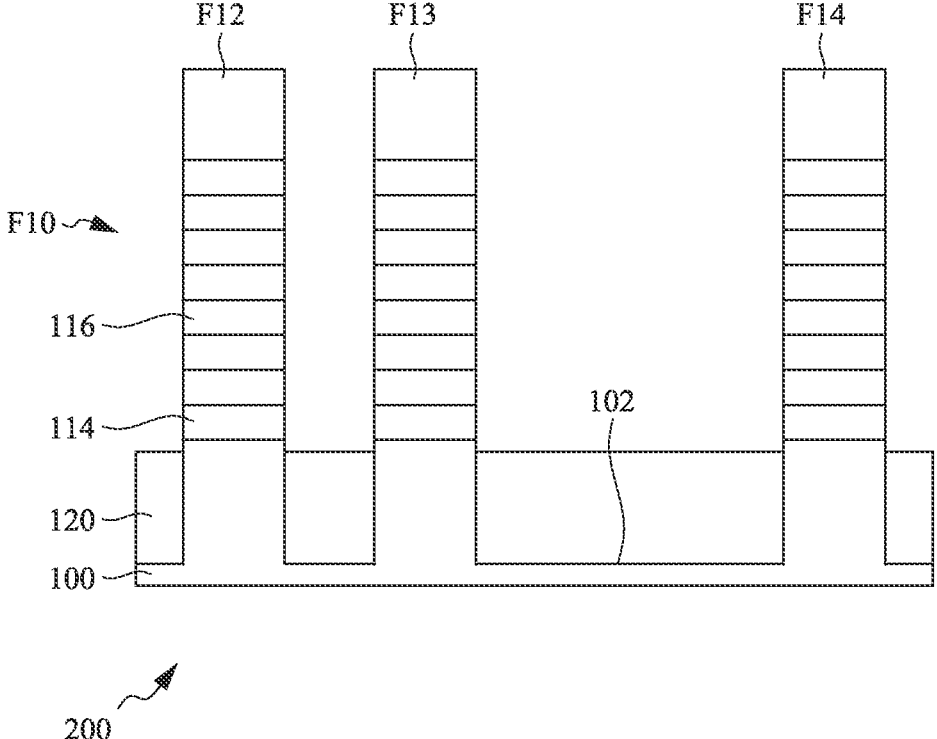
FIGS. 4-13 are cross-sectional views of the partially fabricated device of FIG. 3 during successive stages of fabrication, in accordance with some embodiments.

Cross-referencing FIGS. 1 and 4, the method M10 further includes: (O14) forming isolation 120 around the fin structures F10 and over the unetched portion 102 of the substrate 100. It is noted that FIG. 4, and subsequent FIGS. 5-13, provide a cross-sectional view of a portion (three fin structures F12, F13, and F14) of the device 200 of FIG. 3 along a Y-Z plane for clarity and ease of description.

In exemplary embodiments, the isolation 120 may be considered to be shallow trench isolation (STI) features in trenches adjacent to each fin structures F10. The STI features 120 may be formed by first filling the trenches around each fin structures F10 with a dielectric material layer to cover top surfaces and sidewalls of the fin structures F10 (not shown). The dielectric material layer may include one or more dielectric materials. Suitable dielectric materials for the dielectric layer may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques. The dielectric material layer is then planarized by using, for example, chemical mechanical planarization (CMP), until top surfaces of the mask layer (not shown) are revealed, and the dielectric material layer is recessed to form the shallow trench isolation (STI) features 120, as shown in FIG. 4. In the illustrated embodiment, the STI features 120 are formed on the substrate 100. Any suitable etching technique may be used to recess the isolation features 120 including dry etching, wet etching, RIE, and/or other etching methods, and in an exemplary embodiment, an anisotropic dry etching is used to selectively remove the dielectric material of the isolation features 120 without etching the fin structures F10. The mask layer may also be removed before, during, and/or after the recessing of the isolation features 120. In some embodiments, the mask layer is removed by the CMP process performed prior to the recessing of the isolation features 120. In some embodiments, the mask layer is removed by an etchant used to recess the isolation features 120.

Figure 5:
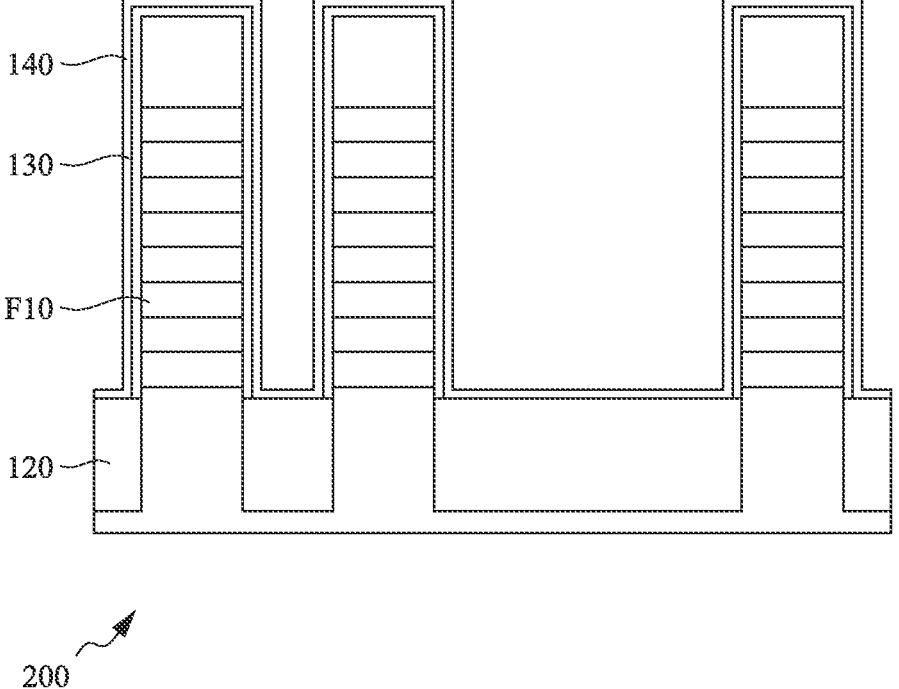

Cross-referencing FIGS. 1 and 5, the method M10 further includes: (O15) selectively growing a semiconductor liner 130 over the fin structures F10. In exemplary embodiments, the semiconductor liner 130 may be SiGe.

Further, the method M10 includes: (O16) conformally depositing a spacer layer 140 over the fin structures F10 and STI features 120. In exemplary embodiments, the spacer layer 140 may include spacer material such as silicon oxide, silicon nitride, silicon carbide, silicon oxynitride, SiCN films, silicon oxycarbide, SiOCN films, and/or combinations thereof. In some embodiments, the spacer layer 140 includes multiple layers, such as a liner layer and a main spacer layer. By way of example, the spacer layer 140 may be formed by depositing spacer material using processes such as a subatmospheric CVD (SACVD) process, a flowable CVD process, an ALD process, a PVD process, or other suitable process respectively.

Figure 6:
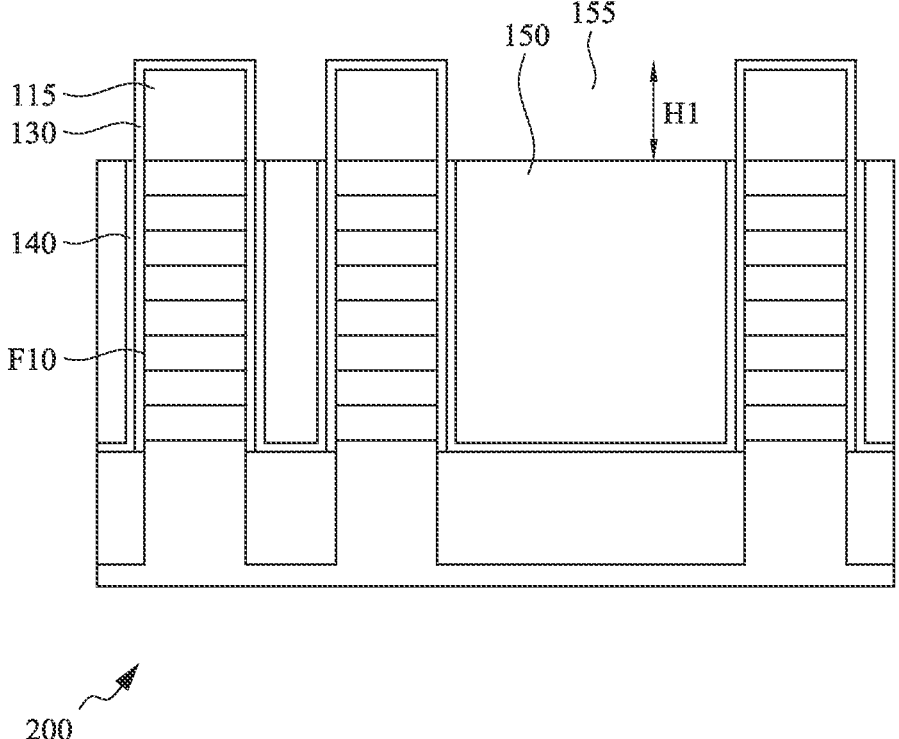

Cross-referencing FIGS. 1 and 6, the method M10 further includes: (O17) depositing a dielectric material 150 over the fin structures F10. In exemplary embodiments, the dielectric material may be silicon oxide. In exemplary embodiments, the dielectric material 150 is blanket deposited.

Further, method M10 includes (O18) recessing the dielectric material 150 and spacer layer 140 over the fin structures F10, as shown in FIG. 6. As a result, gaps 155 are formed between and laterally adjacent the upper portions of the fin structures F10. The gaps 155 are formed with a vertical height H1, in the Z-direction. In exemplary embodiments, height H1 is substantially equal to the sum of the vertical thickness of the top layer 115 and the semiconductor liner 130.

Figure 7:
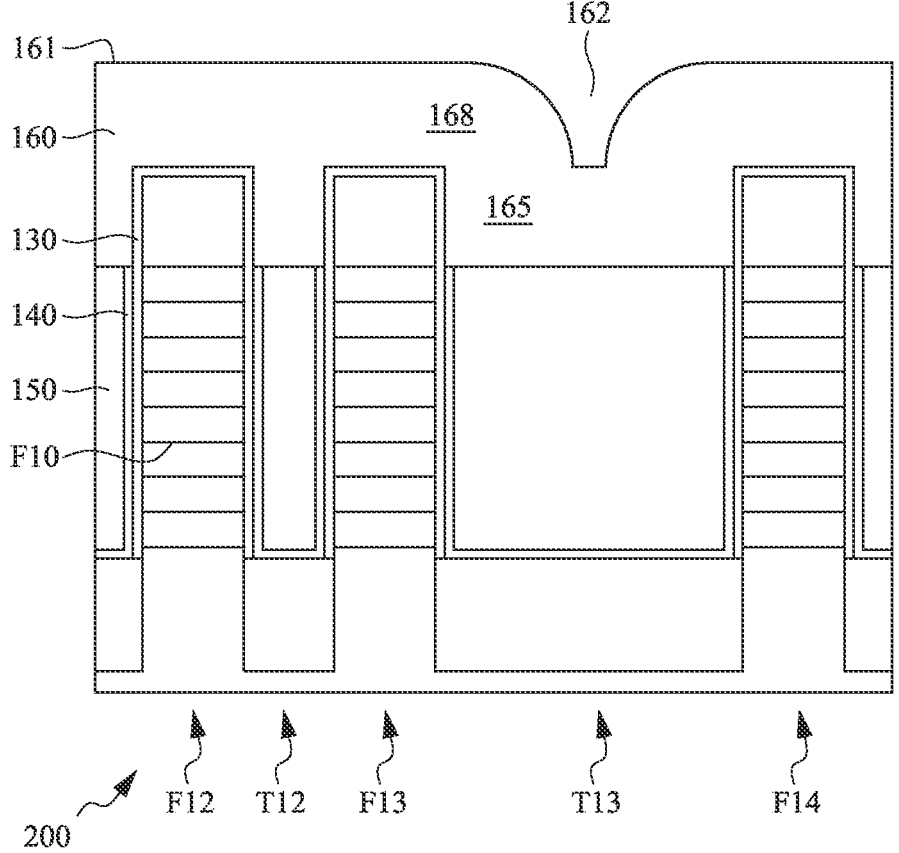

Cross-referencing FIGS. 1 and 7, method M10 continues at operation O19 with depositing a high dielectric constant material 160, i.e., a high-k or high-k material, over the fin structures F10. Specifically, the high-k material 160 may be deposited on the dielectric material 150, spacer layer 140, and semiconductor liner 130. As used herein, high dielectric constant material has a dielectric constant greater than 3.9. In exemplary embodiments, the dielectric constant of the high-k material 160 is greater than 7. In exemplary embodiments, the high-k material 160 comprises a metal oxide, such as hafnium oxide (HfO2).

In exemplary embodiments, the high-k material 160 may be deposited by atomic layer deposition (ALD). Other deposition processes may be used, such as plasma enhanced chemical vapor deposition (PECVD), low-pressure chemical vapor deposition (LPCVD), metal organic chemical vapor deposition (MOCVD), plasma enhanced atomic layer deposition method (PEALD), or similar deposition processes.

In exemplary embodiments, the high-k material 160 is conformally deposited. Thus, the high-k material 160 may be formed with a substantially level or planar surface 161 in high pattern density regions of the device 200, such as over fin structure F12, trench T12, and fin structure F13. Further, the high-k material 160 may be formed with a dip or recess 162 over low pattern density regions of the device 200, such as over trench T13 between fin structure F13 and fin structure F14.

As shown, lower portions 165 of the high-k material 160 are located laterally adjacent to and/or between adjacent fin structures F10 and an upper portion 168 of the high-k material 160 is located above, i.e., at a greater height over the substrate 100 than, the fin structures F10.

Figure 8:
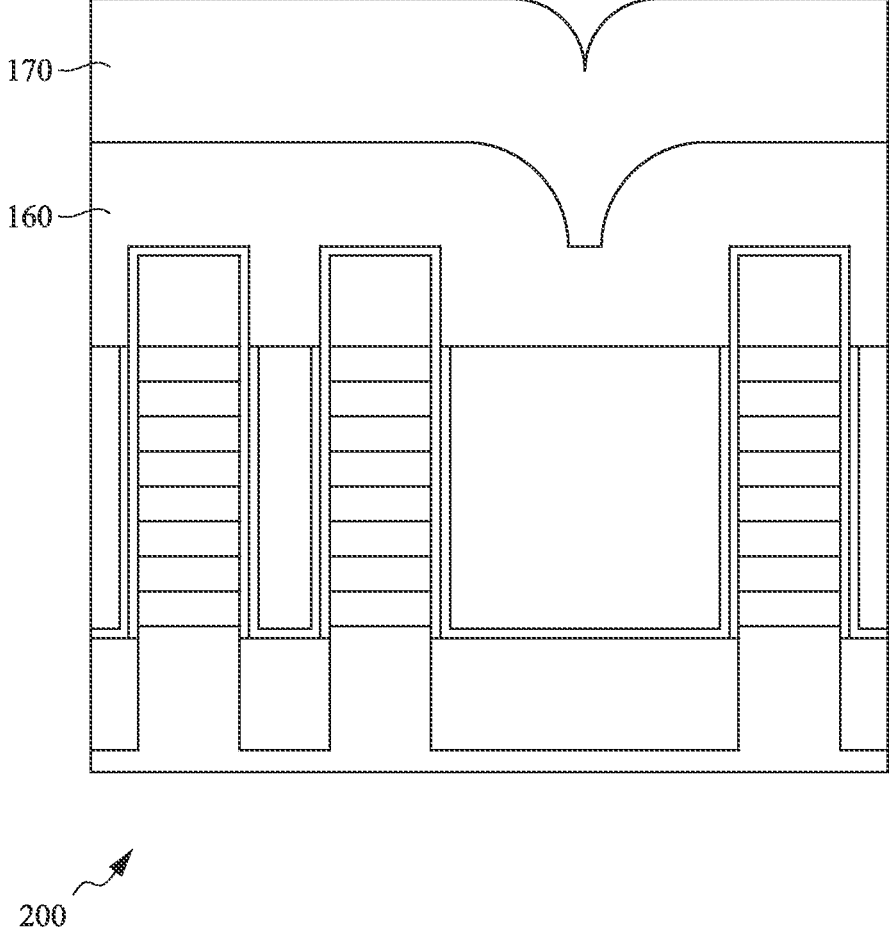

Cross-referencing FIGS. 1 and 8, method M10 continues at operation O20 with forming a capping layer 170 over the high-k material 160. In exemplary embodiments, the capping layer 170 is dielectric layer, such as a silicon oxide (SiO2) layer. In exemplary embodiments, the capping layer 170 is provided to improve topography of the high-k material 160. In exemplary embodiments, the capping layer 170 is conformally deposited. For example, the capping layer 170 may be deposited by plasma enhanced chemical vapor deposition (PECVD) of another suitable process.

Figure 9:
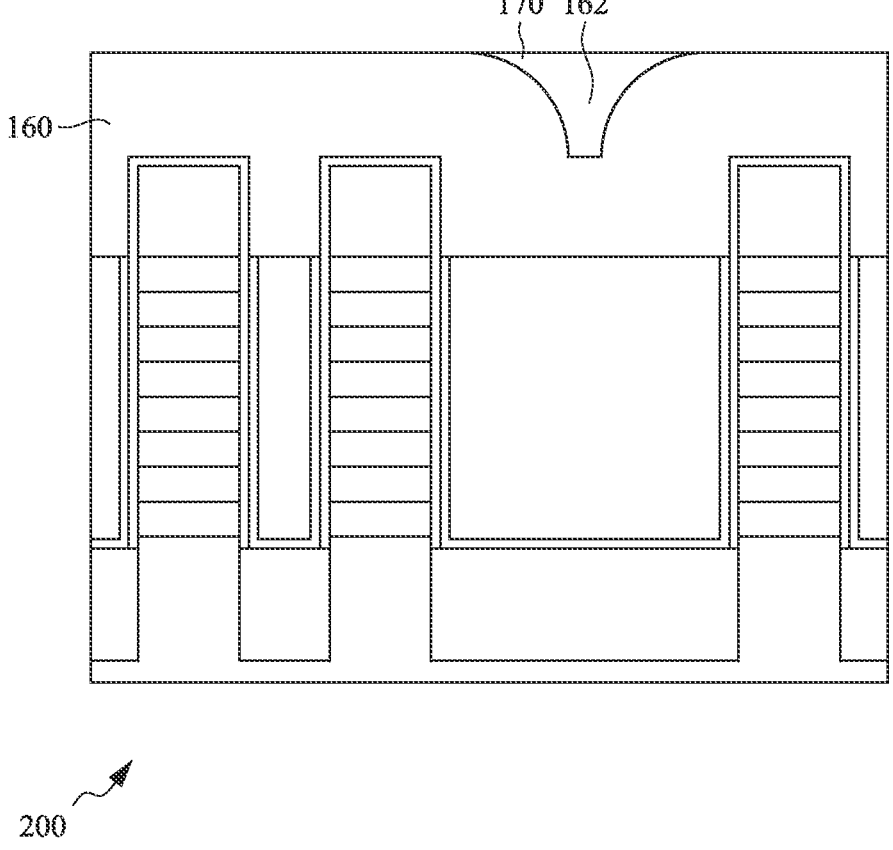

Cross-referencing FIGS. 1 and 9-11, method M10 further includes at operation O21 performing a chemical mechanical planarization (CMP) process. Specifically, the exemplary CMP process includes three stages. In a first stage and as shown in FIG. 9, the CMP process selectively etches the capping layer 170 and lands on the high-k material 160. A portion of the capping layer 170 may remain in the recess 162. In exemplary embodiments, the first stage of the CMP process may be performed with a chemistry that provides for a removal rate of the silicon oxide capping layer 170 of about 1000 Angstrom per minute and a selectivity of 50. Further, the amount of high-k material removed by the first stage of the CMP process may be limited to less than 1 nanometer. In exemplary embodiments, silicon oxide dishing is 4 nanometers, with a space of 0.3 micrometers.

Figure 10:
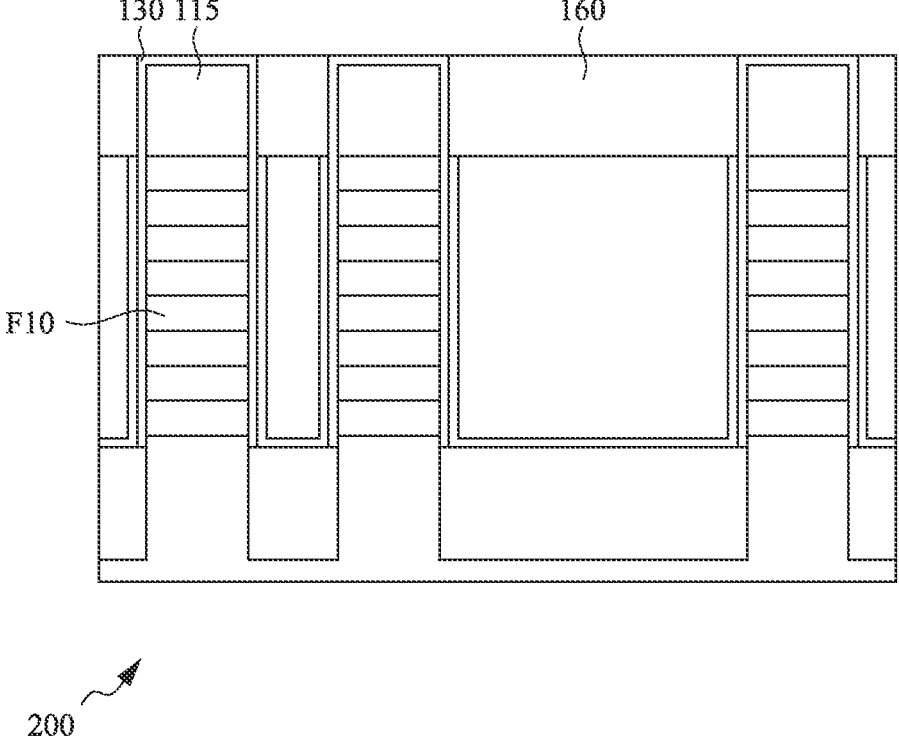

As shown in FIG. 10, a second stage of the CMP process is highly selective to etching the capping layer 170 and the high-k material 160 and lands on the semiconductor material of the fin structure F10, i.e., either on the semiconductor liner 130 (as shown) or on the top layer 115.

In exemplary embodiment, the second stage of the CMP process is performed with a slurry formula comprising silica (SiO2) abrasive. Further, in exemplary embodiments, the silica-based slurry is used with HNO3. In exemplary embodiments, the pH of the slurry formula is from 1 to 5, such as from 2 to 4, for example from 2.5 to 3.5, such as a pH of 3. In exemplary embodiments, the second stage of the CMP process provides a controlled pH to increase a removal rate of the high-k material while suppressing a removal rate of the fin structures. As a result, the second stage of the CMP process is highly selective to etching the high-k material.

Figure 11:
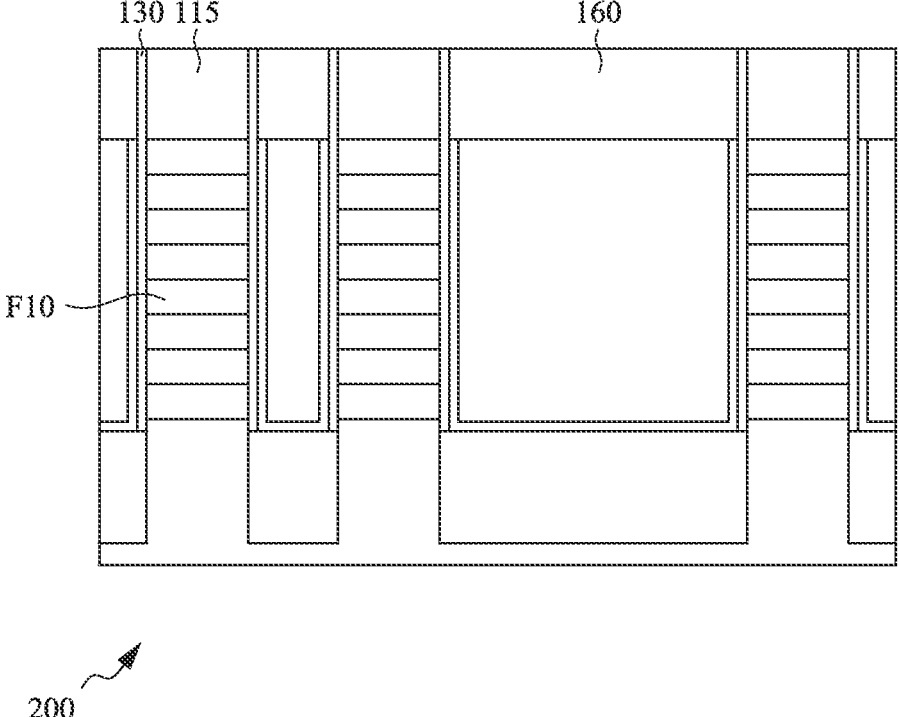

As shown in FIG. 11, a third stage of the CMP process is then performed to provide for selective height control of the high-k material 160. In exemplary embodiments, the third stage is non-selective to etch the high-k material 160 or semiconductor material of the fin structures F10.

Figure 12:
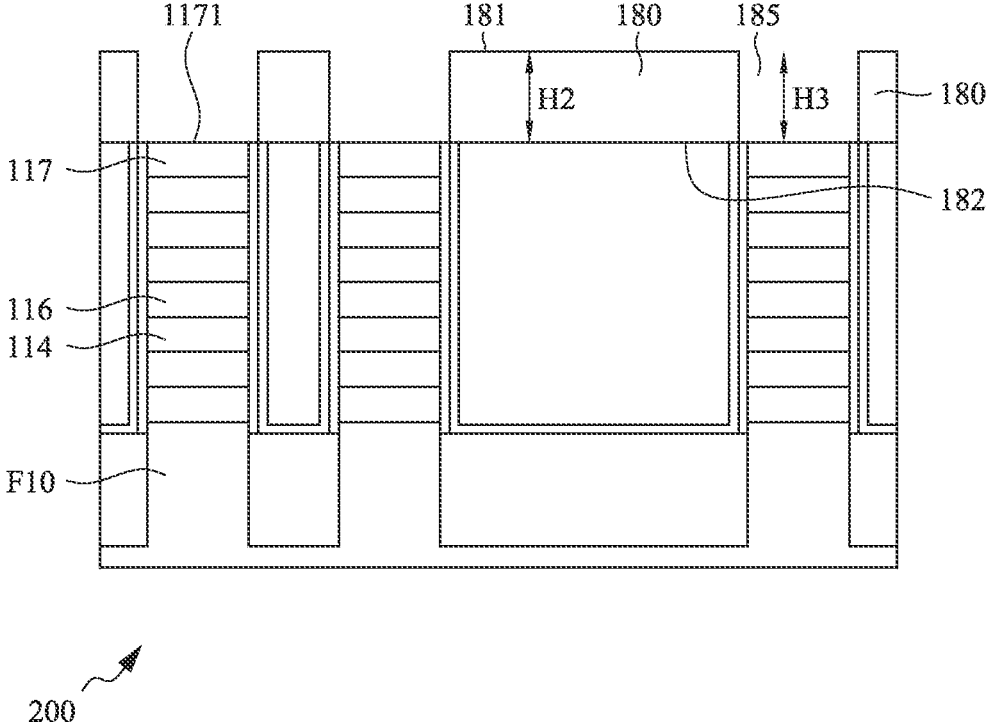

Cross-referencing FIGS. 1 and 12, method M10 continues at operation O22 with removing the top layer 115 of semiconductor material, including the laterally adjacent portion of semiconductor liner 130. For example, the top layer 115 and the laterally adjacent portion of the semiconductor liner 130 may be removed by an etch process selective to the material, such as SiGe, of the top layer 115 and liner 130.

As a result, the partially fabricated semiconductor device 200 of FIG. 12 has high-k isolation regions 180 separated in a lateral direction along the Y-direction by openings 185. Further, each high-k isolation region 180 is formed with an uppermost or top surface 181 located at a vertical height H2 over the uppermost surface 1171 of the top layer 117 of fins structures F10.

It is noted that in FIG. 12, the top surface of the top layer 117 and the bottom surface of the high-k isolation region 180 are substantially co-planar, i.e., the height H2 of the high-k isolation region 180 is equal to the height H3 of the opening 185 or of the removed top layer 115. However, it is contemplated that height H2 and height H3 be different. In certain embodiments, the height H3 of the opening 185 is less than the height H2 of the high-k isolation region 180.

Figure 13:
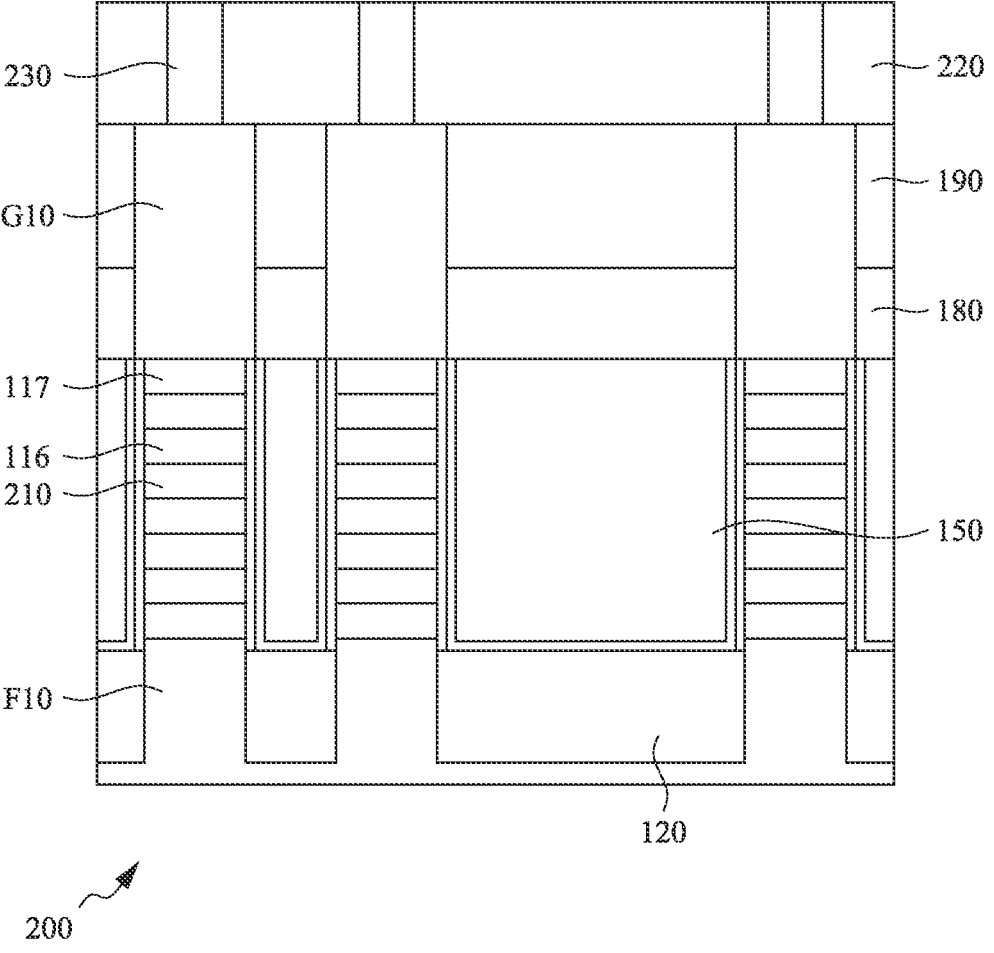

Cross-referencing FIGS. 1 and 13, method M10 continues at operation O23 with further processing for fabricating the semiconductor device 200. For example, the further processing may include depositing polysilicon, patterning the polysilicon to define polysilicon gates, depositing an interlayer dielectric (ILD) 190 around the polysilicon gates, performing a CMP process to open the polysilicon gates, removing the polysilicon gates, removing the semiconductor layers 114 and defining the remaining semiconductor layers 116 as spaced apart nanosheets, depositing metal 210 between and over the remaining semiconductor layers 116 to form metal gates G10 over the fin structures F10, forming an interlayer dielectric 220 over the metal gates G10, and forming contacts 230 to metal gates G10. This further processing results in the structure of the partially fabricated semiconductor device 200 of FIG. 13.

As shown, when the metal gate material 210 is deposited over the fin structures F10, the high-k isolation regions 180 are already present and isolate adjacent metal gates G10 from one another. Thus, method M10 does not include etching trenches laterally adjacent to the metal gates G10 after the metal gate material 210 is deposited.

Figure 14:
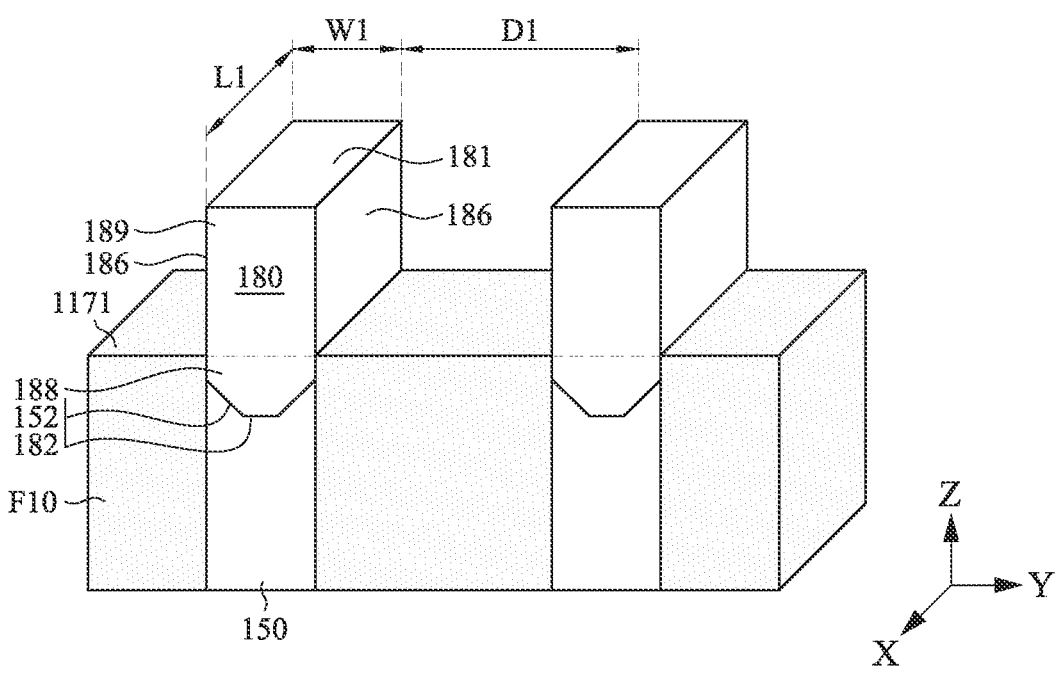
FIG. 14 is a perspective focused view of isolation regions over a dielectric material and between active regions such as fin structures, such as during the fabrication stage of FIG. 12, and in accordance with some embodiments.
Figure 15:
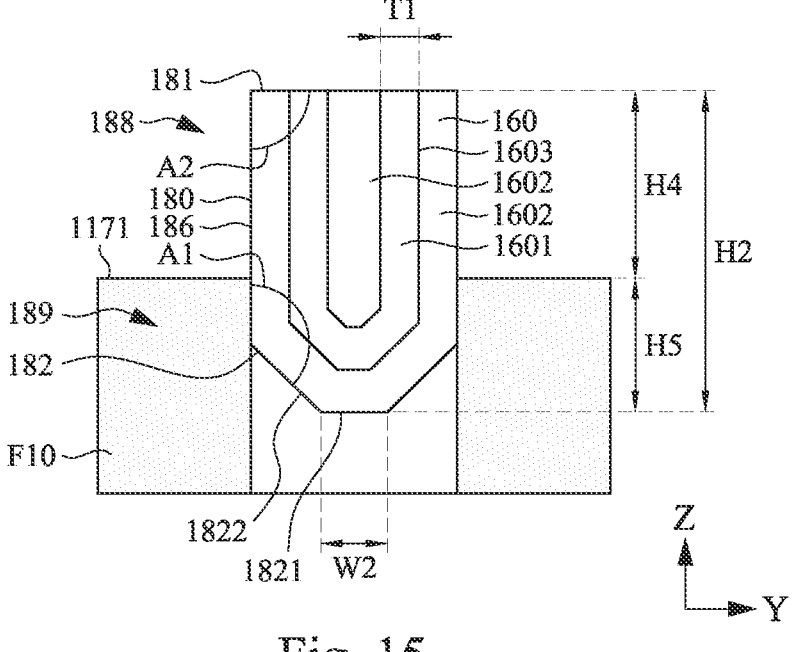
FIG. 15 is a cross-section view of the structure of FIG. 14.

FIGS. 14-21 illustrate further embodiments of the high-k isolation regions 180 formed from high-k material 160 such as hafnium oxide (HfO2). FIG. 14 provides a perspective view of a partially fabricated device 200 at a stage similar to the fabrication stage of FIG. 12. FIG. 15, provides a cross-sectional view, such as along a Y-Z plane, of a high-k isolation region 180 of the device 200 of FIG. 14. It is noted that spacer layer 140 is not shown in FIGS. 14 and 15 may be considered to be part of the dielectric material 150 in FIGS. 14 and 15.

Cross-referencing FIGS. 14 and 15, each high-k isolation region 180 is formed with a vertical height H2 from a bottom surface 182 to a top surface 181. As shown, the top surface 181 of each high-k isolation region 180 is located at a vertical height H4 from the top surface 1171 of the fin structure F10. In the illustrated embodiment, vertical height H2 is greater than vertical height H4. Thus, the high-k isolation region 180 includes a lower portion 188 located below the surface 1171 of the fin structure F10 and an upper portion 189 located above the surface 1171 of the fin structure F10. The lower portion 188 has a vertical height H5 from the bottom surface 182 to the surface 1171. The upper portion 189 has a vertical height H4 from the top surface 181 to the surface 1171. The total height H2 is equal to the sum of height H4 and height H5.

In exemplary embodiments, vertical height H4 is from 5 nanometers (nm) to 100 nanometers (nm). For example, vertical height H4 may be at least 5 nm, at least 10 nm, at least 15 nm, at least 20 nm, at least 25 nm, at least 30 nm, at least 35 nm, at least 40 nm, at least 45 nm, at least 50 nm, at least 60 nm, at least 70 nm, at least 80 nm, or at least 90 nm. Further, vertical height H4 may be at most 10 nm, at most 15 nm, at most 20 nm, at most 25 nm, at most 30 nm, at most 35 nm, at most 40 nm, at most 45 nm, at most 50 nm, at most 60 nm, at most 70 nm, at most 80 nm, at most 90 nm, or at most 100 nm.

In exemplary embodiments, vertical height H5 is from 0 nanometers (nm) to 20 nanometers (nm). For example, vertical height H5 may be at least 1 nm, at least 5 nm, at least 10 nm, or at least 15 nm, and may be at most 20 nm, at most 15 nm, at most 10 nm, or at most 5 nm. It is further contemplated that the bottom surface 182 may be located at a vertical height above the surface 1171 of the fin structure F10. In such embodiments, the vertical height H5 may be considered to be negative, and may be between 0 nanometers (nm) and −20 nanometers (nm). In such embodiments, the vertical height H2 from the bottom surface 182 to the top surface 181 is less than the vertical height H4 from the surface 1171 to the top surface 181.

In certain embodiments, the ratio of height H4:height H5 is from 1:10 to 10:1. For example, the H4:H5 ratio may be at least 1:10, at least 2:10, at least 3:10, at least 4:10, at least 5:10; at least 6:10; at least 7:10; at least 8:10; at least 9:10; at least 10:10; at least 10:9; at least 10:8; at least 10:7; at least 10:6; at least 10:5; at least 10:4; at least 10:3; or at least 10:2. Further, the H4:H5 ratio may be at most 2:10, at most 3:10, at most 4:10, at most 5:10; at most 6:10; at most 7:10;

at most 8:10; at most 9:10; at most 10:10; at most 10:9; at most 10:8; at most 10:7; at most 10:6; at most 10:5; at most 10:4; at most 10:3; or at most 10:2, or at most 10:1.

As shown, each high-k isolation region 180 is formed with a longitudinal length L1 in the X-direction and a lateral width W1 in the Y-direction. Further, the high-k isolation regions 180 are separated by a lateral distance D1 in the Y-direction.

In exemplary embodiments, the high-k isolation regions 180 independently have a length L1 in the X-direction of from 10 to 500 nanometers (nm). For example, length L1 may be at least 10 nm, at least 15 nm, at least 20 nm, at least 25 nm, at least 30 nm, at least 35 nm, at least 40 nm, at least 45 nm, at least 50 nm, at least 60 nm, at least 70 nm, at least 80 nm, at least 90 nm, at least 100 nm, at least 120 nm, at least 140 nm, at least 160 nm, at least 180 nm, at least 200 nm, at least 250 nm, at least 300 nm, at least 350 nm, at least 400 nm, or at least 450 nm. Further, length L1 may be at most 15 nm, at most 20 nm, at most 25 nm, at most 30 nm, at most 35 nm, at most 40 nm, at most 45 nm, at most 50 nm, at most 60 nm, at most 70 nm, at most 80 nm, at most 90 nm, at most 100 nm, at most 120 nm, at most 140 nm, at most 160 nm, at most 180 nm, at most 200 nm, at most 250 nm, at most 300 nm, at most 350 nm, at most 400 nm, at most 450 nm, or at most 500 nm.

In exemplary embodiments, the high-k isolation regions 180 independently have a width W1 in the Y-direction of from 10 to 500 nanometers (nm). For example, width W1 may be at least 10 nm, at least 15 nm, at least 20 nm, at least 25 nm, at least 30 nm, at least 35 nm, at least 40 nm, at least 45 nm, at least 50 nm, at least 60 nm, at least 70 nm, at least 80 nm, at least 90 nm, at least 100 nm, at least 120 nm, at least 140 nm, at least 160 nm, at least 180 nm, at least 200 nm, at least 250 nm, at least 300 nm, at least 350 nm, at least 400 nm, or at least 450 nm. Further, width W1 may be at most 15 nm, at most 20 nm, at most 25 nm, at most 30 nm, at most 35 nm, at most 40 nm, at most 45 nm, at most 50 nm, at most 60 nm, at most 70 nm, at most 80 nm, at most 90 nm, at most 100 nm, at most 120 nm, at most 140 nm, at most 160 nm, at most 180 nm, at most 200 nm, at most 250 nm, at most 300 nm, at most 350 nm, at most 400 nm, at most 450 nm, or at most 500 nm.

In exemplary embodiments, the high-k isolation regions 180 are distanced from one another by a distance D1 in the Y-direction of from 5 to 100 nanometers (nm). For example, distance D1 may be at least 5 nm, at least 10 nm, at least 15 nm, at least 20 nm, at least 25 nm, at least 30 nm, at least 35 nm, at least 40 nm, at least 45 nm, at least 50 nm, at least 60 nm, at least 70 nm, at least 80 nm, or at least 90 nm. Further, distance D1 may be at most 10 nm, at most 15 nm, at most 20 nm, at most 25 nm, at most 30 nm, at most 35 nm, at most 40 nm, at most 45 nm, at most 50 nm, at most 60 nm, at most 70 nm, at most 80 nm, at most 90 nm, or at most 100 nm.

The dielectric material 150 underlying the high-k isolation region 180 may be formed with a non-planar or angled surface 152 as shown. Such a surface 152 may result from the etching process used to recess the dielectric material 150 during operation O18. As shown, the high-k isolation region 180 may be formed with a reciprocal non-planar or angled bottom surface 182. Specifically, the bottom surface 182 may have a central planar portion 1821 and angled portions 1822 interconnecting the central planar portion 1821 to respective sidewalls 186 of the high-k isolation region 180.

As shown, the central planar portion 1821 of the bottom surface 182 has a lateral width W2 in the Y-direction. In exemplary embodiments, lateral width W2 is from 1 to 400 nanometers (nm). For example, width W2 may be at least 1 nm, at least 5 nm, at least 10 nm, at least 15 nm, at least 20 nm, at least 25 nm, at least 30 nm, at least 35 nm, at least 40 nm, at least 45 nm, at least 50 nm, at least 60 nm, at least 70 nm, at least 80 nm, at least 90 nm, at least 100 nm, at least 120 nm, at least 140 nm, at least 160 nm, at least 180 nm, at least 200 nm, at least 250 nm, at least 300 nm, or at least 350 nm. Further, width W2 may be at most 5 nm, at most 10 nm, at most 15 nm, at most 20 nm, at most 25 nm, at most 30 nm, at most 35 nm, at most 40 nm, at most 45 nm, at most 50 nm, at most 60 nm, at most 70 nm, at most 80 nm, at most 90 nm, at most 100 nm, at most 120 nm, at most 140 nm, at most 160 nm, at most 180 nm, at most 200 nm, at most 250 nm, at most 300 nm, at most 350 nm, or at most 400 nm.

As shown, the angled portion 1822 of the bottom surface 182 forms an internal angle A1 with the sidewall 186. In exemplary embodiments, the angle A1 is from 60 to 180 degrees. For example, angle A1 may be at least 60 degrees, at least 65 degrees, at least 70 degrees, at least 75 degrees, at least 80 degrees, at least 85 degrees, at least 90 degrees, at least 95 degrees, at least 100 degrees, at least 105 degrees, at least 110 degrees, at least 115 degrees, at least 120 degrees, at least 125 degrees, at least 130 degrees, at least 135 degrees, at least 140 degrees, at least 145 degrees, at least 150 degrees, at least 155 degrees, at least 160 degrees, at least 165 degrees, at least 170 degrees, or at least 175 degrees. Further, angle A1 may be at most 65 degrees, at most 70 degrees, at most 75 degrees, at most 80 degrees, at most 85 degrees, at most 90 degrees, at most 95 degrees, at most 100 degrees, at most 105 degrees, at most 110 degrees, at most 115 degrees, at most 120 degrees, at most 125 degrees, at most 130 degrees, at most 135 degrees, at most 140 degrees, at most 145 degrees, at most 150 degrees, at most 155 degrees, at most 160 degrees, at most 165 degrees, at most 170 degrees, at most 175 degrees, or at most 180 degrees.

In exemplary embodiments, the top surface 181 of the high-k isolation region 180 is planar and horizontal, i.e., is in an X-Y plane with a constant Z value. The top surface 181 forms an internal angle A2 with each respective sidewall 186. In exemplary embodiments, top surface 181 is horizontal, sidewall 186 is vertical, and angle A2 is 90 degrees. In other exemplary embodiments, angle A2 is from 60 to 120 degrees. For example, angle A1 may be at least 60 degrees, at least 65 degrees, at least 70 degrees, at least 75 degrees, at least 80 degrees, at least 85 degrees, at least 90 degrees, at least 95 degrees, at least 100 degrees, at least 105 degrees, at least 110 degrees, or at least 115 degrees. Further, angle A1 may be at most 65 degrees, at most 70 degrees, at most 75 degrees, at most 80 degrees, at most 85 degrees, at most 90 degrees, at most 95 degrees, at most 100 degrees, at most 105 degrees, at most 110 degrees, at most 115 degrees, or at most 120 degrees.

As shown in FIG. 15, the high-k isolation region 180 is a multi-layer structure formed from layers, such as layer 1601 and layer 1602. As shown, an interface 1603 is formed between layers 1601 and 1602. In FIG. 15, the high-k isolation region 180 includes three layers; however, it is contemplated that the high-k isolation region 180 include from one to twenty layers. Each layer may have a thickness T1 of from 3 to 20 nanometers (nm). For example, each layer may independently have a thickness T1 of at least 3 nm, at least 4 nm, at least 5 nm, at least 6 nm, at least 7 nm, at least 8 nm, at least 9 nm, at least 10 nm, at least 11 nm, at least 12 nm, at least 13 nm, at least 14 nm, at least 15 nm, at least 16 nm, at least 17 nm, at least 18 nm, or at least 19 nm. Further, each layer may independently have a thickness T1 of at most 4 nm, at most 5 nm, at most 6 nm, at most 7 nm, at most 8 nm, at most 9 nm, at most 10 nm, at most 11 nm, at most 12 nm, at most 13 nm, at most 14 nm, at most 15 nm, at most 16 nm, at most 17 nm, at most 18 nm, at most 19 nm, or at most 20 nm.

In exemplary embodiments, the layers 1601 and 1602 are formed from a same material, such as high-k material 160, for example hafnium oxide. In other exemplary embodiments, the layers 1601 and 1602 are formed from different materials. For example, one layer may be formed from a high-k material 160 and the other layer may be an insertion layer formed from another type of material, such as a material configured to improve the crystal uniformity of the material of the other layer.

FIGS. 16-18 provide three schematic views of exemplary high-k isolation regions 180 as multi-layer structures formed from layers and located over a dielectric material 150. In FIG. 16, two layers 1601 are formed from a high-k material such as hafnium oxide. Further, two layers 1602 are formed from a uniformity-improving material. An exemplary uniformity-improving material in layer 1602 reduces crystal non-uniformity in layer 1601. For example, layer 1602 may be formed from silicon dioxide (SiO2). In the exemplary embodiment of FIG. 16, layers 1601 may each have a thickness of 14 nanometers (nm) and layers 1602 may each have a thickness of 6 nanometers (nm). Thus, high-k isolation region 180 has a thickness of 40 nanometers (nm).

In FIG. 17, four layers 1601 are formed from a high-k material such as hafnium oxide. Further, two layers 1602 are formed from a uniformity-improving material. An exemplary uniformity-improving material in layer 1602 reduces crystal non-uniformity in layer 1601. For example, layer 1602 may be formed from silicon dioxide (SiO2). In the exemplary embodiment of FIG. 17, layers 1601 may each have a thickness of 9 nanometers (nm) and layers 1602 may each have a thickness of 4 nanometers (nm). Thus, high-k isolation region 180 has a thickness of 44 nanometers (nm).

In FIG. 18, three layers 1601 are formed from a high-k material such as hafnium oxide. Further, two layers 1602 are formed from a uniformity-improving material. An exemplary uniformity-improving material in layer 1602 reduces crystal non-uniformity in layer 1601. For example, layer 1602 may be formed from silicon dioxide (SiO2). In the exemplary embodiment of FIG. 17, layers 1601 may each have a thickness of 12 nanometers (nm) and layers 1602 may each have a thickness of 4 nanometers (nm). Thus, high-k isolation region 180 has a thickness of 44 nanometers (nm).

While FIGS. 16-18 provide suitable multi-layer structures for a high-k isolation region 180, other suitable structures are envisioned and may be selected to provide the desired isolation and processing properties. It is noted that the high-k material layer may be formed only as internal layers, as in FIGS. 17 and 18, or as an exterior layer as in FIG. 16.

Cross-referencing FIGS. 15-18, it may be seen that the top surface 181 of the high-k isolation region 180 may be formed from layer 1601 and 1602, such that the top surface 181 may be formed from layers of hafnium oxide and layers of silicon oxide.

In exemplary embodiments, the insertion layer 1602 improves the quality of the high-k material layer 1601, and of the multi-layer isolation region 180. Specifically, devices 200 formed with multi-layer isolation regions 180 may have reduced within-die "WiD" variation, i.e., increased WiD uniformity, as compared to devices 200 formed with single material isolation regions.

While FIGS. 11-13 illustrate a semi-square high-k isolation region 180 having a planar bottom surface 182, and FIGS. 14-15 illustrate a semi-octagon high-isolation region

180 having a bottom surface 182 formed with a central planar portion 1821 and angled portions 1822, other high-k isolation regions 180 are contemplated.

For example, FIG. 19 provides an illustration of a semi-circular high-k isolation region 180 having a semi-circular bottom surface 182. Further, FIG. 20 provides an illustration of a semi-hexagon high-k isolation region 180 having a bottom surface 182 formed by angled portions 1822 that intersect at an interface 1823. FIG. 21 provides an illustration of an inverted semi-hexagon high-k isolation region 180 having a bottom surface 182 formed by inverted angled portions 1824 that intersect at an interface 1825. While these shapes are illustrated and described, the high-k isolation region 180 may be formed with a bottom surface 182 having another shape.

Figures 22, 23, 24, 25:
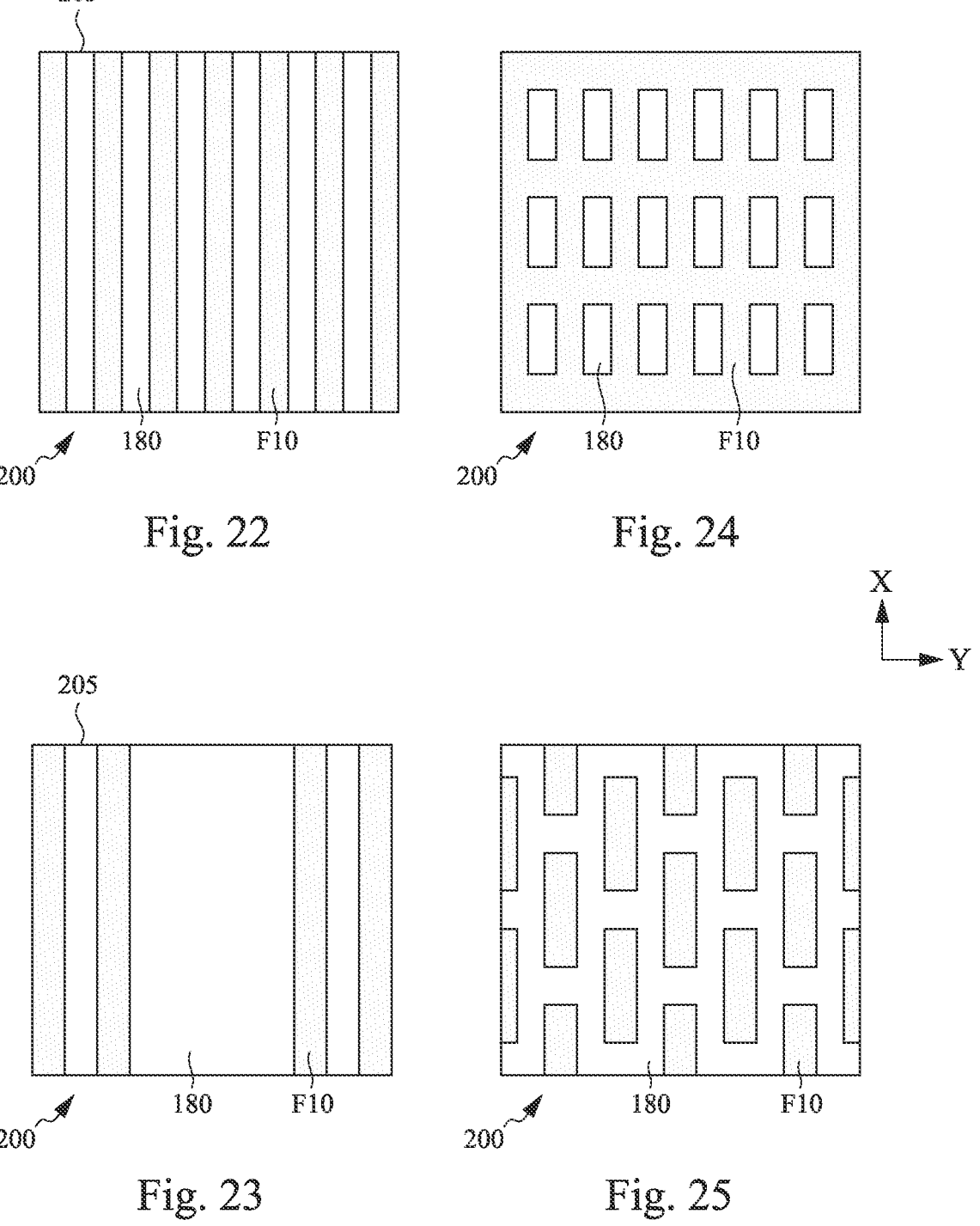
FIGS. 22-25 are simplified top-down layout views of partially fabricated devices, such as at the stage of fabrication of FIG. 12, in accordance with some embodiments.

Further, the high-k isolation regions 180 may be formed with a desired layout shape. FIGS. 22-25 provide simplified top-down layout views of partially fabricated devices 200, such as at the stage of fabrication of FIG. 12. In FIG. 22, a unit cell 205 of a device 200 is formed with high-k isolation regions 180 extending completely across the unit cell 205 in the X-direction and with fin structures F10 extending completely across the unit cell 205 in the X-direction. The high-k isolation regions 180 have equal widths in the Y-direction and are equally spaced apart from one another in the Y-direction.

In FIG. 23, a unit cell 205 of a device 200 is formed with high-k isolation regions 180 extending completely across the unit cell 205 in the X-direction and with fin structures F10 extending completely across the unit cell 205 in the X-direction. The high-k isolation regions 180 have different widths in the Y-direction and are equally spaced apart from one another in the Y-direction.

In FIG. 24, the device 200 includes high-k isolation regions 180 having a rectangular footprint. The exemplary high-k isolation regions 180 have equal lengths in the X-direction and equal widths in the Y-direction. Further, the high-k isolation regions 180 are equally spaced from one another in the X-direction and are equally spaced from one another in the Y-direction. The layout of FIG. 24 may be described as a grid.

In FIG. 25, the device 200 includes high-k isolation regions 180 forming a continuous layer interrupted by fin structures F10 having a rectangular footprint. The exemplary fin structures F10 have equal lengths in the X-direction and equal widths in the Y-direction and are equally spaced from one another in the X-direction and equally spaced from one another in the Y-direction.

Figure 26:
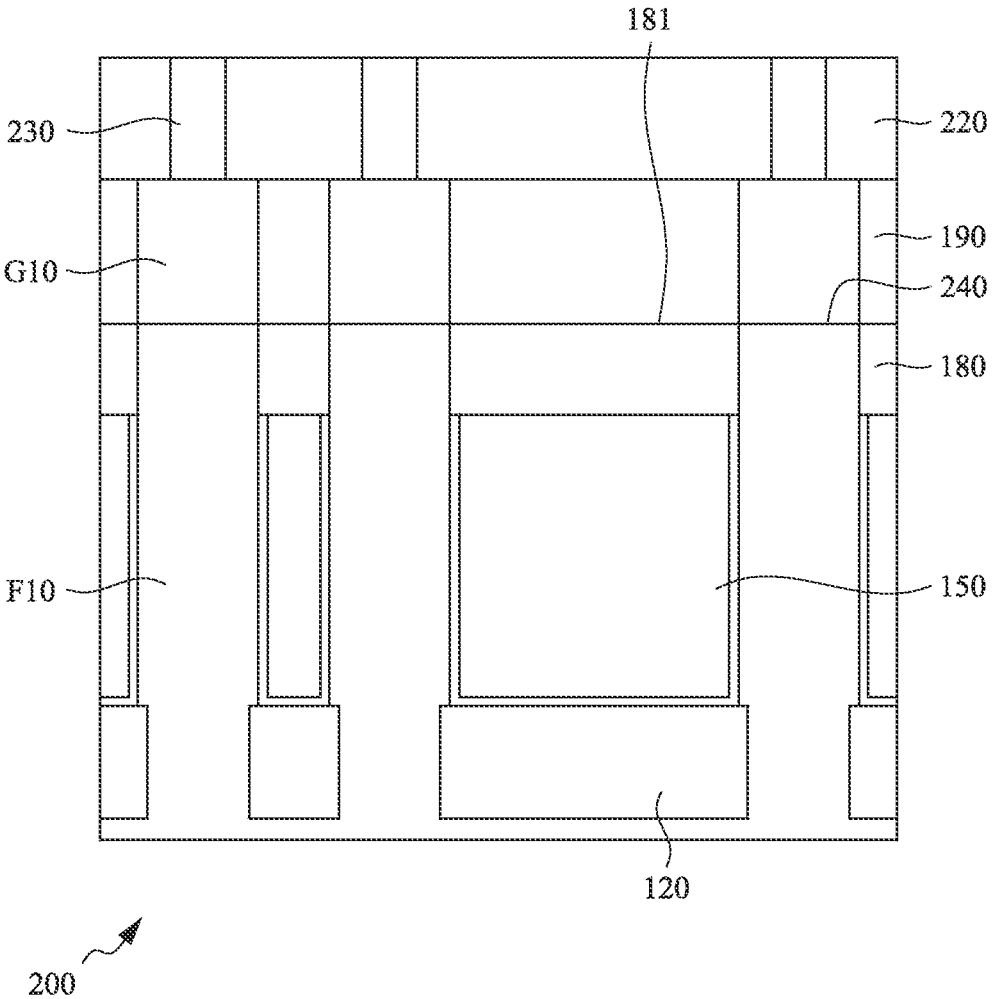
FIG. 26 is a cross-sectional view of device, such as during the fabrication stage of FIG. 12, and in accordance with some embodiments.

Referring now to FIG. 26, another embodiment of a semiconductor device 200 is illustrated. In FIG. 26, the fin structures F10 are hybrid fin structures formed from hybrid fin material, such as SiCN. In an exemplary embodiment, the hybrid fin structures F10 contact the gates G10 at an interface 240 that is co-planar with the top surface 181 of the high-k isolation region 180. A method for fabricating the device 200 of FIG. 26 is similar to method M10, but for the formation of the hybrid fin structures F10 rather than the nanosheet fin structures, and the removal of the top nanosheet layer that results in the opening 185 in FIG. 12. As a result, the gates G10 are formed over hybrid fin F10 at a height equal to the height of the high-k isolation region 180.

Thus, one of the embodiments of the present disclosure describes a method including forming fin structures separated by an isolation material; depositing a high-k material over the fin structures and isolation material, wherein the high-k material includes lower portions located between fin structures and an upper portion located above the fin structures; depositing a topography-improving capping layer over the high-k material; and performing a chemical mechanical planarization (CMP) process to remove the capping layer and the upper portion of the high-k material and to define high-k insulation segments.

In certain embodiments of the method, the high-k material is hafnium oxide.

In certain embodiments of the method, depositing the high-k material comprises forming a multi-layer structure comprised of layers of hafnium oxide and interposing uniformity-improving layers.

In certain embodiments of the method, the high-k material is hafnium oxide and the capping layer is silicon oxide.

In certain embodiments of the method, the CMP process comprises: a first stage selective to etching the capping layer and that lands on the high-k material; a second stage selective to etching the high-k material and that lands on the fin structures; and a third stage that is non-selective.

In certain embodiments of the method, the CMP process provides a controlled pH to increase a removal rate of the high-k material while suppressing a removal rate of the fin structures.

In certain embodiments of the method, the CMP process uses a slurry formula comprising silica abrasive and HNO3, and a pH of the slurry formula is from about 1 to about 5.

In certain embodiments, the method further includes removing a top layer from each fin structure to form each fin structure with an uppermost surface located at a height below an upper surface of the high-k insulation segments; and forming a metal gate over each fin structure and between the high-k insulation segments.

In another embodiment, a method includes forming a fin structure; forming a high-k isolation region laterally adjacent to the fin structure, wherein the high-k isolation region has an upper surface; and removing a top layer of the fin structure to form the fin structure with an uppermost surface located at a height below the upper surface of the high-k isolation region.

In certain embodiments of the method, the fin structure comprises alternating layers of a first fin material and a second fin material and wherein the method further comprises: forming a sacrificial gate over the uppermost surface of the fin structure; depositing dielectric material around the sacrificial gate; removing the sacrificial gate; removing layers of a fin material selected from the first fin material and the second fin material, wherein layers of a non-selected fin material remain; and forming a metal gate around and over the layers of the non-selected fin material.

In certain embodiments of the method, the high-k isolation region comprises hafnium oxide.

In certain embodiments of the method, forming the high-k isolation region comprises forming a multi-layer structure comprised of layers of hafnium oxide and interposing uniformity-improving layers.

In certain embodiments of the method, forming the high-k isolation region comprises forming a multi-layer structure comprised of layers of hafnium oxide and interposing silicon oxide layers.

In certain embodiments of the method, forming the high-k isolation region comprises: depositing hafnium oxide over and around the fin structure; forming a capping layer over the hafnium oxide; and performing a chemical mechanical planarization (CMP) process to remove the capping layer and an upper portion of the hafnium oxide and to form the high-k isolation region and the top layer of the fin structure with a planar upper surface.

In another embodiment, a semiconductor device is provided and includes a semiconductor fin structure; a gate structure located over the semiconductor fin structure; and a hafnium oxide isolation region laterally adjacent to the semiconductor fin structure.

In certain embodiments of the device, the semiconductor fin structure comprises spaced apart nanosheets of semiconductor material including an upper nanosheet defining an uppermost surface of the semiconductor fin structure; the gate structure is located between and above the nanosheets; and the hafnium oxide isolation region has a top surface at a height above the uppermost surface of the semiconductor fin structure.

In certain embodiments of the device, the semiconductor fin structure is a hybrid fin structure comprising SiCN and having an uppermost surface; and the hafnium oxide isolation region has a top surface substantially co-planar with the uppermost surface of the semiconductor fin structure.

In certain embodiments of the device, the hafnium oxide isolation region comprises alternating layers of hafnium oxide and a uniformity-improving material.

In certain embodiments of the device, the hafnium oxide isolation region comprises alternating layers of hafnium oxide and silicon oxide.

In certain embodiments of the device, the hafnium oxide isolation region comprises alternating layers of hafnium oxide and silicon oxide; the hafnium oxide isolation region has a top surface; and the top surface is formed by at least two layers of hafnium oxide and at least one layer of silicon oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
forming fin structures separated by an isolation material;
selectively growing a semiconductor liner over the fin structures;
depositing a high-k material over the fin structures and the isolation material, wherein the high-k material includes lower portions located between the fin structures and includes an upper portion located above the fin structures;
depositing a capping layer over the high-k material; and
performing a planarization process to remove the capping layer and the upper portion of the high-k material and to define high-k insulation segments.

2. The method of claim 1, wherein the high-k material is hafnium oxide.

3. The method of claim 1, wherein depositing the high-k material comprises forming a multi-layer structure comprised of layers of hafnium oxide and interposing uniformity-improving layers.

4. The method of claim 1, wherein the high-k material is hafnium oxide and the capping layer is silicon oxide.

5. The method of claim 1, wherein the planarization process comprises a first stage selective to etching the capping layer and that lands on the high-k material;

a second stage selective to etching the high-k material and that lands on the fin structures; and a third stage that is non-selective.

6. The method of claim 1, wherein the planarization process provides a controlled pH to increase a removal rate of the high-k material while suppressing a removal rate of the fin structures.

7. The method of claim 1, wherein the planarization process uses a slurry formula comprising silica abrasive and $HNO_3$, and wherein a pH of the slurry formula is from about 1 to about 5.

8. The method of claim 1, further comprising:

removing the semiconductor liner and a top layer from each fin structure to form each fin structure with an uppermost surface located at a height below an upper surface of the high-k insulation segments; and forming a metal gate over each fin structure and between the high-k insulation segments.

9. A method comprising:

forming a fin structure, wherein the fin structure comprises an epitaxial stack including alternating layers of a first semiconductor material and a second semiconductor material;

forming a high-k isolation region laterally adjacent to the fin structure, wherein the high-k isolation region has an upper surface; and removing a top layer of the second semiconductor material of the fin structure to form the fin structure with an uppermost surface located at a height below the upper surface of the high-k isolation region.

10. The method of claim 9, wherein the method further comprises:

forming a sacrificial gate over the uppermost surface of the fin structure;

depositing a dielectric material around the sacrificial gate;

removing the sacrificial gate;

removing layers of the second semiconductor material, wherein layers of the first semiconductor material remain; and forming a metal gate around and over the layers of the first semiconductor material.

11. The method of claim 9, wherein the high-k isolation region comprises hafnium oxide.

12. The method of claim 9, wherein forming the high-k isolation region comprises forming a multi-layer structure comprised of layers of hafnium oxide and interposing uniformity-improving layers.

13. The method of claim 9, wherein forming the high-k isolation region comprises forming a multi-layer structure comprised of layers of hafnium oxide and interposing silicon oxide layers.

14. The method of claim 9, wherein forming the high-k isolation region comprises:

depositing hafnium oxide over and around the epitaxial stack of the fin structure;

forming a capping layer over the hafnium oxide; and performing a chemical mechanical planarization (CMP) process to remove the capping layer and an upper portion of the hafnium oxide and to form the high-k isolation region with an upper surface coplanar with the top layer.

15. A semiconductor device comprising:

a fin structure;

a gate structure located over the fin structure; and a hafnium oxide region laterally adjacent to the fin structure, wherein the hafnium oxide region comprises alternating layers of hafnium oxide and a uniformity-improving material.

16. The semiconductor device of claim 15, wherein:

the fin structure comprises spaced apart nanosheets of semiconductor material including an upper nanosheet defining an uppermost surface of the fin structure;

the gate structure is located between and above the nanosheets;

the hafnium oxide region has a top surface at a height above the uppermost surface of the fin structure; and the hafnium oxide region has a bottom surface that is non-planar.

17. The semiconductor device of claim 15, wherein:

the fin structure is a hybrid fin structure comprising SiCN and having an uppermost surface; and the hafnium oxide region has a top surface substantially co-planar with the uppermost surface of the fin structure.

18. The semiconductor device of claim 15, wherein the uniformity-improving material comprises silicon oxide.

19. The semiconductor device of claim 15, wherein the hafnium oxide region comprises alternating layers of hafnium oxide and silicon oxide.

20. The semiconductor device of claim 15, wherein:

the hafnium oxide region comprises alternating layers of hafnium oxide and silicon oxide;

the hafnium oxide region has a top surface; and the top surface is formed by at least two layers of hafnium oxide and at least one layer of silicon oxide.

* * * * *